United States Patent [19]
Koskenmaki et al.

[11] Patent Number: 5,413,659
[45] Date of Patent: May 9, 1995

[54] ARRAY OF CONDUCTIVE PATHWAYS

[75] Inventors: David C. Koskenmaki, St. Paul; Clyde D. Calhoun, Grant Township, Washington County, both of Minn.

[73] Assignee: Minnesota Mining and Manufacturing Company, St. Paul, Minn.

[21] Appl. No.: 129,667

[22] Filed: Sep. 30, 1993

[51] Int. Cl.6 .......................... H01B 7/08; B32B 3/28
[52] U.S. Cl. ..................... 156/229; 156/257; 156/265; 156/268; 174/117 FF; 29/413; 437/226
[58] Field of Search ............... 156/229, 160, 257, 264, 156/265, 268, 589, 399; 174/117 FF; 437/226; 29/412, 413, 414, 415; 225/2

[56] References Cited

U.S. PATENT DOCUMENTS

| | | | |
|---|---|---|---|
| 2,897,627 | 8/1975 | Klatskin | 437/226 X |
| 3,542,266 | 11/1970 | Woelfe | 437/226 |
| 3,554,832 | 1/1971 | Fischer | 150/229 |
| 3,606,035 | 8/1969 | Gantley | 29/413 X |
| 3,677,875 | 7/1972 | Althouse | 437/226 X |
| 3,707,760 | 1/1973 | Citrin | 29/413 X |
| 3,918,150 | 4/1975 | Gantley | 29/413 X |
| 4,250,217 | 2/1981 | Greenaway | 428/161 X |
| 4,296,542 | 10/1981 | Gotman | 29/413 X |
| 4,549,795 | 10/1985 | Simms | 351/163 X |
| 4,914,815 | 4/1990 | Takada | 29/413 X |
| 4,931,598 | 6/1990 | Calhoun et al. | 174/117 F |
| 5,059,262 | 10/1991 | Calhoun et al. | 156/47 X |

FOREIGN PATENT DOCUMENTS

| | | | |
|---|---|---|---|
| 0060567 | 5/1977 | Japan | 437/226 |
| 0107563 | 8/1981 | Japan | 437/226 |

OTHER PUBLICATIONS

P. H. Wojciechowski, M. S. Mendolia; On the Multiple Fracture of Low-Elongation Thin Films Deposited on High Elongation Substrates. J. Vac. Sci. Technol. A, vol. 7, No. 3, May/Jun. 1989, pp. 1282–1288.

*Primary Examiner*—David A. Simmons
*Assistant Examiner*—Charles Rainwater
*Attorney, Agent, or Firm*—Gary L. Griswold; Walter N. Kirn; H. Sanders Gwin, Jr.

[57] ABSTRACT

The present invention provides metal/polymer composites including a plastic substrate having longitudinally extending conductive members, adapted to make bonded electrical connections to an array of closely spaced conductive terminal pads. In general terms, the metal/polymer composites include a thin, flexible sheet-like plastic substrate having a plurality of longitudinally extending, regularly spaced, metal pathways or members on one major surface thereof.

16 Claims, 2 Drawing Sheets

ARRAY OF CONDUCTIVE PATHWAYS

TECHNICAL FIELD

This invention relates to conductive sheet materials having an array of conductive lines, and particularly to such an array that is useful for making electrical connections between electronic components, particularly on an extremely small scale.

BACKGROUND OF THE INVENTION

As electronic devices become increasingly compact and portable, the need to make precise electrical connections between components on a very small scale increases. Arrays of fine, closely spaced, parallel electrical conductors are often needed to connect arrays of closely spaced, side-by-side pads found on printed circuit boards, liquid crystal displays, display panels, charge-couple devices, or the like.

In electronic devices, electronic components are typically arranged with extreme space restrictions. Therefore, electrical connectors are often required to be flexible and to have closely spaced, parallel conductive stripes provided on a flexible insulating support. See, e.g., U.S. Pat. No. 5,059,262 and U.S. Pat. No. 4,931,598. Other methods of producing parallel conductive stripes include: a) conductive inks, b) thin metal wires, or c) stripes of thin metal films, e.g., deposited through a mask or selectively etched to provide the desired conductor width and spacing.

There are disadvantages inherent in the presently known electrical connector tape constructions. Electrical connector tapes that use conductive inks as the conductive stripes typically have an undesirably high resistance. The manufacture of electrical connector tape using thin metal wires for the conductive stripes requires drawing the metal wires down to size and attaching the wires to a flexible insulating support. Known methods are typically difficult and expensive. Stripes made by means of photolithographic techniques are often complicated and also expensive.

In presently known electrical connector tapes, the tape is often constructed such that the spacing of the individual conductive stripes is the same as that of the terminal pads to which the tape is intended to be bonded. Accordingly, when the bonds are made between the conductive stripes and an array of terminal pads, it is necessary that absolute registration be maintained between the stripes and the pads during bonding. The fine pitch of many arrays of terminal pads makes such registration very difficult. Thus, it is often necessary to use magnifying devices when bonding the electrical connector tape to the terminals. However, if the pitch of the electrical connectors is so fine that one or more conductive stripes will contact a terminal pad during bonding, absolute registration may not be necessary. However, it will still be necessary, in most applications, to maintain a generally parallel alignment to prevent cross-over connections.

SUMMARY OF THE INVENTION

The present invention provides a method for producing an array of parallel conductive members or pathways on a plastic substrate on a very fine scale in an economical fashion.

In general terms, the method of the present invention and the resulting metal/polymer composites include a plastic substrate having a metal layer provided on a surface of the substrate. The conductive pathways are formed in a number of ways, including stretching the plastic substrate in a direction perpendicular to the generally longitudinal direction of the conductive pathways. The metal/polymer composite is constructed to have a plurality of longitudinal, localized extension regions spaced at locations in the composite so that when the plastic substrate is stretched, elongation will preferentially occur in these localized areas. This causes the metal layer to fracture and/or separate in these areas. The separation of the metal layer results in the formation of separate, conductive pathways. The spacing or pitch of the conductive members can be controlled by the amount of stretching that takes place. The localized extension regions can be imparted by physical construction of the composite such as by scribing the metal layer or causing the plastic layer to be thinner in these regions compared to the surrounding regions. The extension regions may also be formed by varying the chemical composition or crosslinking of the substrate or adding fillers in certain regions to weaken the substrate in those regions.

The present invention provides a number of embodiments, each of which provides the desired conductive pathways carried on a substrate. These embodiments are based on the relative stress-strain behavior during stretching of a composite of one or more polymer layers and an overlying metal layer, the layers of which may vary in thickness.

One method of the present invention includes providing a sheet-like polymeric substrate with at least a component of plastic behavior at the desired stretching temperature and strain rate and with a metal layer coated on one surface thereof.

"Sheet-like," as used herein, refers to a substrate having lateral dimensions (width and length) that far exceed the thickness of the substrate. A polymeric film is an example of a sheet-like substrate having a length and width many magnitudes greater than the thickness. The metal layer may be embossed or scored by an appropriate means to provide a series of parallel grooves in the metal layer. The grooves need not provide discrete metal regions, but need to be sufficiently scored to reduce the cross sectional area of the metal layer perpendicular to the direction of stretching, thus increasing the localized stress in the composite in the region of the grooves to a level exceeding the fracture stress of the metal when the plastic substrate is stretched. This locally deformable region allows the metal to separate in these areas when the plastic substrate is stretched. Stretching in this manner provides a metal/polymer composite that includes a plastic substrate having an array of separate, longitudinally extending conductive stripes or members provided on one planar surface of the plastic substrate.

Another embodiment of the present invention includes a plastic substrate having a rigid or brittle polymeric layer coated thereon. The rigid polymeric layer includes a series of longitudinally extending ridges, for example, having a cross-section of an isosceles triangle or arcuate surface. The rigid polymer has a metal layer coated thereon. Upon stretching of the plastic substrate, the rigid polymer does not stretch, but breaks along its grooves and thereby breaks the overlying metal layer into the desired longitudinally extending conductive members.

A still further embodiment of the present invention includes a plastic substrate having a component of plastic stress-strain behavior and having a plurality of ridges or thicker portions extending throughout the length of the substrate. The surface of the plastic substrate having the ridges or protrusions is coated with a thin, metal layer. Upon stretching of the plastic substrate in a direction perpendicular to the ridges, the thinner portions of the substrate exceed the yield stress and elongate locally while the thicker portions do not, thus breaking the metal layer into the desired longitudinally extending conductive members.

Another embodiment of the present invention provides an embossed polymeric substrate, preferably plastic, having an embossed pattern with ridges that have a perpendicular face and a deposition face. When metal is deposited onto the embossed surface of the polymeric substrate, preferably at an angle perpendicular to the deposition face, metal is deposited only on the deposition face leaving the perpendicular face substantially free from metal. Thus, parallel conductive members are provided on the array of conductive faces that are stretched to further separate the conductive members from one another into the desired spacing.

DETAILED DESCRIPTION OF THE INVENTION

The present invention provides metal/polymer composites including a plastic substrate having longitudinally extending conductive members adapted to make bonded electrical connections to an array of closely spaced conductive terminal pads. The metal/polymer composites are useful as, for example, electrical connector tapes for making electrical connections between electronic components. In general terms, composites include a thin, flexible sheet-like plastic substrate having a plurality of longitudinally extending, regularly spaced, metal pathways or members on one lateral surface thereof. As used herein, "longitudinally extending" means having a dimension in a length direction that is magnitudes greater than the height or width of the element. For example, a conductive metal line or pathway lying on the surface of a polymer has a length of many times greater than its height or width. Such longitudinally extending conductive members are useful, for example, in making electrical connections between two devices.

Figure 1:
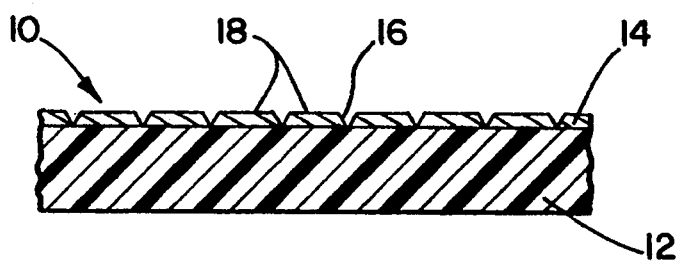
FIG. 1 is a schematic cross-sectional view of a metal/polymer composite of the invention prior to stretching.

Referring to FIG. 1, a metal/polymer composite 10 is shown. The composite 10 includes a plastic substrate 12 and a metal layer 14. The metal layer 14 has a plurality of regularly spaced grooves 16 formed therein thereby partitioning the metal layer 14 into a plurality of metal regions 18.

Figure 2:
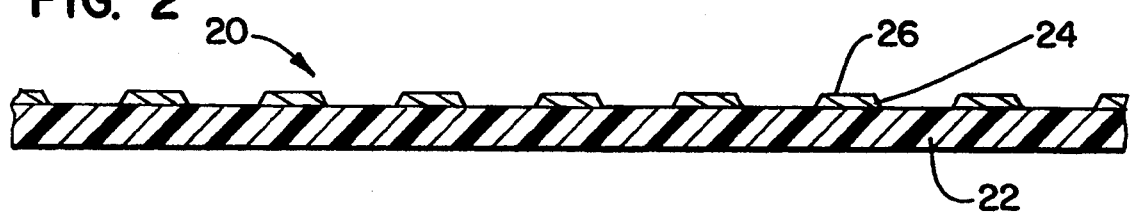
FIG. 2 is a schematic cross-sectional view of the metal/polymer composite of FIG. 1 after stretching.

Referring to FIG. 2, a metal/polymer composite 20 is shown. The composite 20 represents the composite 10 of FIG. 1 having been stretched in a direction perpendicular to the length to the grooves 16 shown in FIG. 1. The composite 20 includes a plastic substrate 22, conductive members 24 having conductive surfaces 26. The conductive members 24 are metal lines or stripes provided on the surface of the plastic substrate 22.

Figure 3:
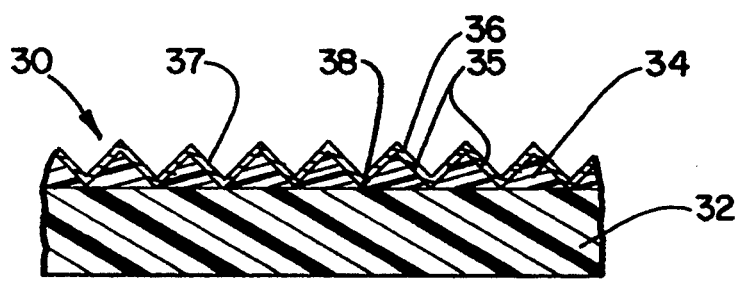
FIG. 3 is a schematic cross-sectional view of a metal/polymer composite of the invention prior to stretching.

Referring to FIG. 3, a metal/polymer composite 30 is shown. The composite 30 includes a plastic substrate 32, a rigid polymeric layer 34, and a metal layer 36. The rigid polymeric layer 34 has a plurality of rigid members 35 having a cross-section of an isosceles triangle. The metal layer 36 is coated on the rigid polymeric layer 34 so as to have a corresponding conductive faces 37 forming grooves 38.

Figure 4:
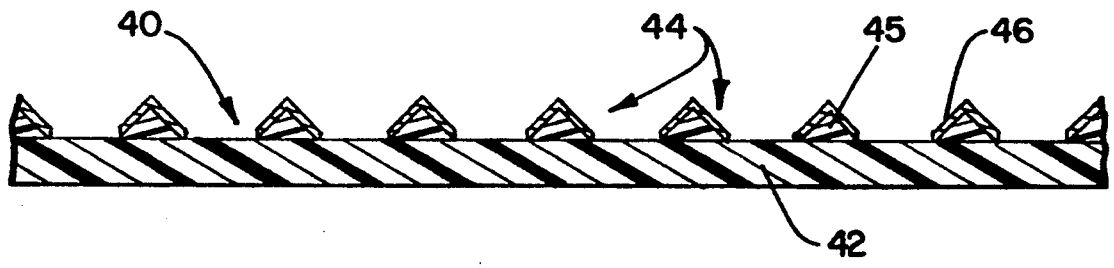
FIG. 4 is a schematic cross-sectional view of the metal/polymer composite of FIG. 3 after stretching.

Referring to FIG. 4, the composite 30 of FIG. 3 is shown having been stretched in a direction perpendicular to the grooves 38 shown in FIG. 3. The plastic substrate 32 stretches while the rigid polymeric layer 34 does not, thereby separating the metal conductive faces 37 along the grooves 38. The metal/polymer composite 40 shown in FIG. 4 includes a plastic substrate 42 and a plurality of conductive members 44, each conductive member 44 including a rigid polymeric core 45 and a conductive surface 46. The typical ratio between the thickness of the plastic substrate 32 and the rigid polymeric layer 34 measured at is thickest point is 1:1 to 100:1.

Figure 5:
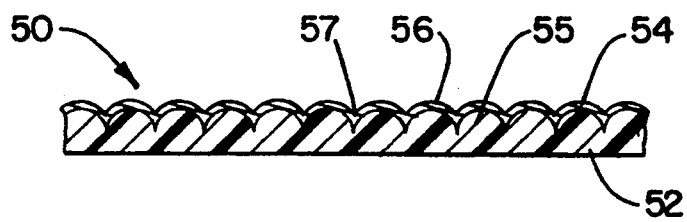
FIG. 5 is a schematic cross-sectional view of a metal/polymer composite of the invention prior to stretching.

Referring to FIG. 5, a metal/polymer composite 50 is shown. The composite 50 includes a plastic substrate 52 and a metal layer 54. The plastic substrate 52 includes a plurality of ridges or arcuate portions 55 having a corresponding arcuate metal portion 56 provided thereon. A plurality of regularly spaced grooves 57 separate the arcuate metal portions 56. Typically, the ratio of the thickness of said plastic substrate at said ridges to the thickness at said grooves is about 1.2:1 to 10:1.

Figure 6:
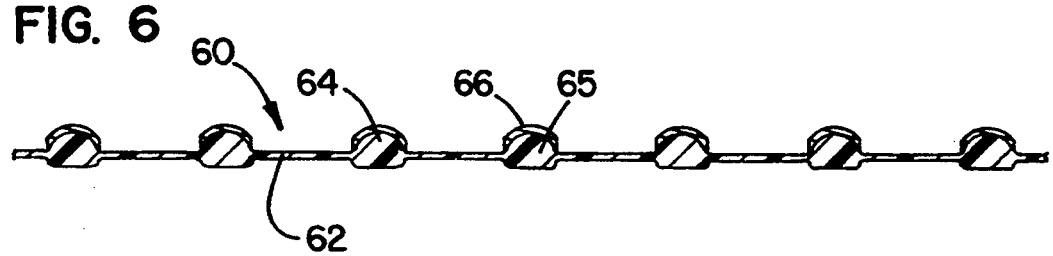
FIG. 6 is a schematic cross-sectional view of the metal/polymer composite of FIG. 5 after stretching.

Referring to FIG. 6, a metal/polymer composite material 60 is shown representing the composite 50 of FIG. 5 having been stretched in a direction perpendicular to the grooves 57. The composite 60 includes plastic substrate 62 and a plurality of conductive members 64, each including a plastic portion 65 and a conductive surface 66.

Figure 7:
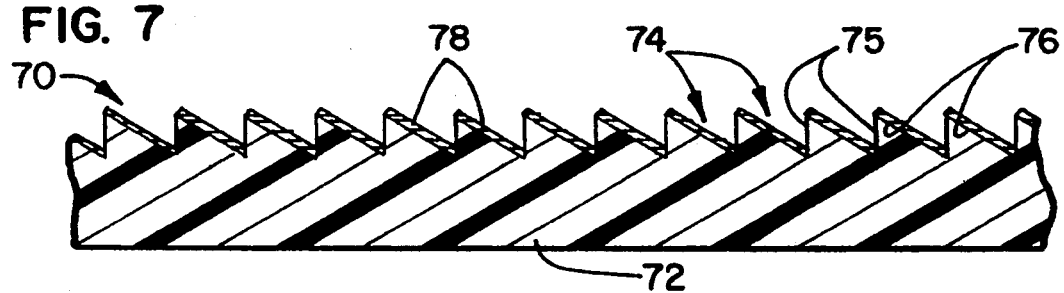
FIG. 7 is a schematic cross-sectional view of a metal/polymer composite of the invention prior to stretching.

Referring to FIG. 7, a sheet material 70 is shown. The sheet material 70 includes a plastic substrate 72 having a plurality of ridges 74. The ridges 74 include perpendicular faces 75 and deposition faces 76. A plurality of regularly spaced conductive metal surfaces 78 are provided on the deposition faces 76.

Figure 8:
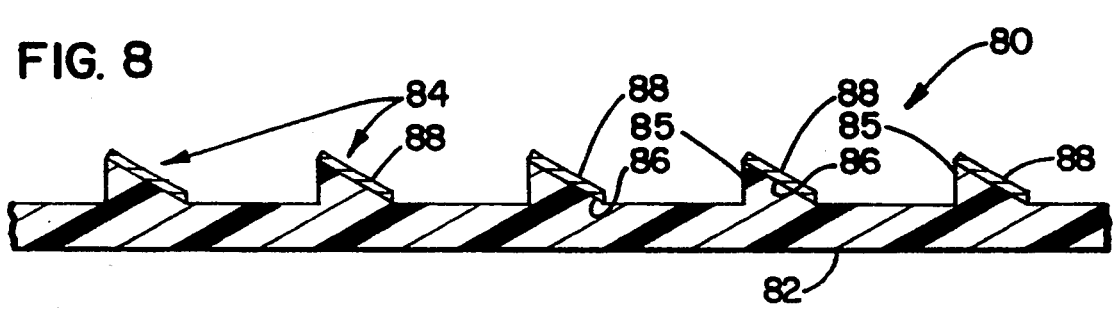
FIG. 8 is a schematic cross-sectional view of the metal/polymer composite of FIG. 7 after stretching.

Referring to FIG. 8, a sheet material 80 is shown. The sheet material 80 includes a plastic substrate 82 having a plurality of ridges 84. The ridges 84 include perpendicular faces 85 and deposition faces 86. A plurality of regularly spaced conductive metal surfaces 88 are provided on the deposition faces 86.

Plastic Materials

A wide variety of plastic materials can be used in the present invention. Suitable thermoplastic polymers for use as the plastic substrate in the composites of the present invention include polyamides; polyolefins, including ethylene, polypropylene, methylpentene and blends thereof; polyurethanes; polysulfones; linear polyesters, such as polyethyleneterephthalate; cellulose esters, such as cellulose acetate, and cellulose propionate; halogenated polyolefins; polyacetals; acrylonitrile styrene resins; polyphenylene oxide plus styrene resin (Noryl ®). Suitable plastic materials include homopolymers, oligopolymers and blends of two or more polymeric materials.

Preferred polymers include a polyester formed from terephthalic acid and one or more diols selected from the group consisting of ethylene glycol, propylene glycol, 1,4 butane diol, 1,6 hexane diol, and 1,4 cyclohexane dimethanol.

In the embodiments that require a rigid polymeric material that is resistant to stretching, a cured, thermoset material such an epoxy or polycarbonate may be used.

Metal Layer

The present invention requires that a metal layer or film be provided on the polymeric layer or layers.

Examples of preferred metals for use in the composite of the present invention include tin, lead, copper, nickel, silver, gold, zinc, indium, aluminum, and their alloys, and mixtures thereof; copper and aluminum are most preferred. The metals, metal alloys or mixtures of metals and metal alloys are preferably utilized in a substantially pure form.

The process of the present invention involves first providing a metal layer adhered to a substrate. One method of providing a metal layer is vacuum deposition. A metal vapor is formed in a vacuum chamber and a continuous layer of this metal is deposited onto the polymeric substrate. In a typical vapor deposition process, the minimum thickness needed to form a continuous metal layer is about 200 angstroms. More than one layer of a single metal can be deposited to form the metal layer, as well as multiple layers of different metals.

A preferred method of forming the metal vapor in the vacuum is through one of several means of evaporation. Sputtering would also be suitable, albeit involving typically slower deposition rates.

A preferred form of evaporation is evaporation by means of heating the metal with an electron beam. Typically, the metal is placed in a small water-cooled metal crucible and an electron beam is produced and focused on the metal in the crucible by means of a magnetic field. An electron beam power supply commercially available from Airco Temescal is an example of a suitable apparatus. Other methods for heating metals to cause evaporation include resistive heating and induction.

After the metal vapor is created, the vapor moves through the vacuum chamber and a portion of it condenses on the substrate thereby forming a metal layer. It is preferred that the substrate be a moving web which is passed through the metal vapor in the vacuum chamber at a speed sufficient to deposit a layer of the metal having a desired thickness. A layer of at least about 200 angstroms thick must typically be formed on the polymeric substrate because thinner layers tend to form islands of the metal and not the desired continuous metal layer. It is preferred that the thickness of the deposited metal layer be between about 500 and about 10,000 angstroms.

Depending on the substrate used, there are a wide variety of additional methods for providing a metal layer onto a substrate including, laminating a thin foil or membrane of the desired metal; or electroplating.

In certain embodiments it is necessary to emboss or score the metal by an appropriate means to provide a series of parallel grooves in the metal layer. The grooves need not partition the metal layer into discrete metal regions but only sufficiently score the metal layer so as to permit separation by stretching. The metal layer may be scored or partitioned by means of, for example, embossing, laserscribing, photolithography, etching, mechanical scratching, or cracking, with embossing being preferred.

Processing Parameters

In several of the embodiments, the plastic substrate is heated and stretched in a direction perpendicular to the grooves or ridges in the surface of the metal layer.

Stretching of the plastic layer can be accomplished as follows: heating to soften the polymer (above $T_g$) and then tentering in one direction. Suitable stretching apparatuses include the T. F. Long film stretcher available from T. F. Long of Somerville, N.J. Typically, stretching takes place at a temperature of about 70° C.–150° C.

There are many possible variations in the processes of the present invention. Stretching of a metal layer provided on the plastic substrate can be conducted in a uniform fashion so as to provide parallel conductive members on a substrate. Alternatively, a substrate can be stretched non-uniformly, for example, in a fan pattern so that the lines are closely spaced in one region and more widely spaced in an adjacent region. Such a construction may be useful to connect finely spaced conductors in a chip to a larger scale circuit.

Once the conductive lines or members are formed, they may be transferred from one substrate to another. In addition, adhesive layers or other components may be added to form a desired composite, such as a conductive transfer tape. For example, the conductive lines may be overcoated with a pressure-sensitive adhesive or a conductive transfer adhesive to aid in making electrical connections. In addition, the lines may be overcoated with a polymeric layer for the purpose of protecting the conductive members from abrasion or corrosion.

In addition to making parallel conductor electrical tapes, the methods of the present invention can also be used to make transparent conductive sheet materials. For example, the polymeric substrates having parallel conductive members can be laminated together in a face-to-face arrangement with the conductive lines placed perpendicular to and touching the lines of the adjacent metal/polymer composite. The result is a cross-hatched pattern of conductive lines sandwiched between two polymeric substrates. The methods of the present invention are capable of making lines that are sufficiently fine in scale so that they are not visible to the naked eye. Alternatively, the cross-hatched mesh of lines can be formed on a polymer surface by transferring a first set of conductive members to a remote substrate followed by transferring a second set of conductive members to the remote substrate in a perpendicular alignment.

The scale to which the metal conductive members can be produced is limited only by the scale to which the structures described above can be made. For example, the parallel-ridged pattern can be machined or otherwise formed into a surface of an embossing or casting master tool or roll. Parallel ridges can be micromachined to 2 $\mu$m spacings and, as needed, to less than 1 $\mu$m spacings. There are various methods to make diffraction gratings, for examples, using holography. Such methods can be used to make parallel-ridged surfaces to a fraction of a micrometer spacing. These finely spaced ridged surfaces can then be duplicated from a glass surface to form a master tool by electroforming a metal such as nickel against the glass surface. Metal polymers of the present invention will typically have at least 200 lines/cm and preferably 500 lines/cm.

The methods of the present invention can be made so as to be continuous. Embossing of a substrate can be accomplished using a roll with ridges in the surface of the roll parallel to the axis of the roll. In this case, the stretching would be done using successively higher rotational rates in successive rolls. Alternatively, the embossing roll could have ridges or oriented circumferentially and the embossed film could be tentered transversely using known production methods. One set of embossing ridges can provide a variety of spacings depending on the amount of stretch chosen.

The invention will be further described by the following non-limiting examples.

EXAMPLE 1

A composite of the present invention was made by first coating a 20 cm wide by 0.25 mm thick web of cast polyethylene terephthalate (PET) with a 0.4 $\mu$m thick film of copper by electron beam (e-beam) evaporation. This was done in a vacuum web coater in which a 300 gram pot of copper was evaporated from a water-cooled copper hearth using an e-beam current of 0.23 A and 9.2 kV. The molten copper pot was 20 cm from the web of cast polyester which was in contact with a drum moving at 1 m/min. Portions of the resulting copper coated web were cut into squares 11 cm on a side. Nickel dies having parallel ridge patterns on one surface with 0.025 mm, 0.05 mm, and 0.1 mm spacings on respective dies were placed against the copper coated PET with the patterned faces against the copper film. These were placed in a hydraulic press at room temperature and pressed with a pressure of 28–35 MPa to emboss parallel grooves into the copper film. To better distribute the pressure over the entire surface of the copper film, a sheet of 0.3 cm thick rubber was placed between one of the platens and the backside of the copper coated PET samples before pressing. A second sheet of 0.3 cm thick rubber was placed between the other platen and the backside of the nickel die.

The samples were then placed into a T. F. Long film stretcher with its sample chamber heated to 110° C. The samples were allowed to warm up for 1 minute and were then stretched for 12 seconds to 250% of their original dimension in a direction perpendicular to the groove direction in the copper film.

The resulting samples had parallel copper lines, although, particularly near the edges of the sample, the lines were not perfect but were broken into segments. A 5 cm wide area in the centers of the stretched samples were mostly free of broken lines. From the center area of the sample having a 0.05 mm groove spaced, a 5 cm by 2.5 cm piece of ethyl vinyl acetate (EVA) sheet was bonded to the copper lines using a heated iron. The EVA was cooled and striped from the PET. In the process the copper lines were transferred to the EVA. The EVA was then placed against another portion of the same sample (PET) and again heated and bonded to the PET. The EVA was then cooled and striped from the PET, in the process transferring a second set of copper lines to the EVA. The second set was perpendicular to the first set so as to form a cross-hatched grid on the surface of the EVA.

EXAMPLE 2

A composite of the present invention was made using similar deposition conditions as in Example 1 except that the PET substrate was coated at 2 m/min and the resulting copper coating was 0.2 $\mu$m thick. A nickel die with a parallel ridge pattern of 4 $\mu$m (0.004 mm) spacing was used to emboss the copper coated surface in a manner similar to that of Example 1. The sample was heated to 110° C. and stretched 200% perpendicular to the embossed grooves in the copper film, and the resulting parallel copper lines had a spacing of 8 $\mu$m center-to-center (1250/cm).

EXAMPLE 3

A composite of the present invention was made as follows: A square sample of 0.10 mm thick polyvinyl chloride (PVC) measuring 11 cm on a side and having 0.05 mm spaced 0.0375 mm deep cast ridge pattern of a UV cured urethane acrylate clearcoat on one surface and an acrylic pressure sensitive adhesive (PSA) on the other surface was coated on the patterned surface with 0.4 $\mu$m of copper as in Example 1. This construction was bonded on the PSA side against a 0.25 mm thick piece of cast PET. The composite was then stretched in the T. M. Long film stretcher using the same conditions as in Example 1. The resulting sample had parallel lines of copper roughly 0.05 mm in width and separated by 0.15 mm center-to-center. There were few, if any, breaks in the copper lines. The electrical resistance of the copper lines was roughly 20 ohms/cm.

EXAMPLE 4

A 1.75 m by 15 cm wide by 0.23 mm thick piece of polypropylene with cast parallel grooved pattern 0.3 mm center-to-center and 0.15 mm deep was used to make composites of the present invention. The sample was coated with 0.02 $\mu$m of copper on the grooved side using the process of Example 1. It was then stretched 300% at room temperature in a direction perpendicular to the grooves. The resulting sample stretched only in the thin regions between the ridges. The ridges remained intact and the copper film coated on the ridges formed continuous parallel conductors with a resistance of roughly 15 ohms/cm.

What is claimed is:

1. A method of making a metal/polymer composite having a plurality of electrically conductive, metal members, said method comprising the steps of:
   a) providing a plastic substrate with a thin, metal layer deposited on a first major surface thereof, said first major surface of said substrate having a plurality of alternating grooves and ridges spaced along a given first direction, said grooves and ridges extending generally longitudinally along a second direction on said first major surface;

b) stretching said plastic substrate in said first direction, whereby said metal layer is separated along each of said alternating grooves and ridges to provide an array of closely spaced, conductive members extending longitudinally in said second direction.

2. A method according to claim 1 wherein said extension regions comprise parallel grooves in said metal layer.

3. A method according to claim 1 wherein said array comprises a regular array of closely spaced, parallel conductive members.

4. A method according to claim 1 wherein said plastic substrate is stretched non-uniformly to provide an array of conductive members in a fan pattern, the spacing between said members generally increasing in said longitudinal direction.

5. A method according to claim 1 including the step of transferring a second set of longitudinally extending electrically conductive members to said substrate having an array of conductive members such that said second set of conductive members is perpendicular to said array of conductive members thereby providing a cross-hatched array of conductive members.

6. A method according to claim 1 wherein said sheet-like plastic substrate has a thickness of about 0.05 to 2 mm.

7. A method according to claim 1 wherein said metal layer has a thickness of about 0.05 to 5 $\mu$m.

8. A method according to claim 1 wherein said conductive members are provided in a density of greater than 20 members per centimeter.

9. A method according to claim 1 wherein said conductive members are provided in a density of greater than 500 members per centimeter.

10. A method according to claim 1 wherein the ratio of the thickness of said substrate at said ridges to the thickness at said grooves is about 1.2:1 to about 10:1.

11. A method of making a metal/polymer composite comprising a sheet material having a plurality of longitudinally extending conductive members comprising the steps of:

a) providing an embossed plastic layer having a planar surface having an embossed pattern formed therein, consisting of a plurality of ridges, said ridges having a perpendicular face and a deposition face, said perpendicular face being substantially perpendicular to said planar surface of said polymeric layer;

b) providing a metal layer on said deposition face;

c) stretching said plastic layer in a direction perpendicular to the longitudinal dimension of said ridges;

thereby providing a plurality of longitudinally extending conductive members.

12. A method of making a metal/polymer composite having a plurality of electrically conductive, metal members, said method comprising the steps of:

a) providing a substrate comprising a first plastic sheet adhered to a first major surface of a relatively rigid, polymeric layer, wherein a second major surface of said polymeric layer has extension regions spaced along a given first direction, said regions extending longitudinally along a second direction on said second major surface;

b) depositing a thin metal layer on the second surface of said polymeric layer;

c) stretching said plastic substrate in said first direction, whereby said metal layer is separated along each of said extension regions to provide an array of conductive members extending longitudinally in said second direction.

13. A method according to claim 12 wherein said rigid polymeric layer is selected from the group consisting of epoxy polymers and polycarbonate polymers.

14. A method according to claim 12, wherein said extension regions are alternating grooves and ridges.

15. A method according to claim 12, wherein said plastic substrate is stretched non-uniformly to provide an array of conductive members in a fan pattern, the spacing between said members generally increasing in said longitudinal direction.

16. A method according to claim 14 wherein the thickness of said plastic substrate and the thickness of said rigid polymeric layer at said thickest points adjacent said grooves have a thickness ratio of about 1:1 to about 100:1.

* * * * *